United States Patent
Bash et al.

(10) Patent No.: US 8,248,793 B2
(45) Date of Patent: Aug. 21, 2012

(54) ELECTRONIC COMPONENT HAVING A MOVABLE LOUVER

(75) Inventors: Cullen E. Bash, Los Gatos, CA (US); Henry C. Coles, Saratoga, CA (US); Shailesh N Joshi, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 170 days.

(21) Appl. No.: 12/748,835

(22) Filed: Mar. 29, 2010

(65) Prior Publication Data
US 2011/0235272 A1 Sep. 29, 2011

(51) Int. Cl.
*H05K 7/20* (2006.01)
*H05K 5/00* (2006.01)
*A47B 77/08* (2006.01)

(52) U.S. Cl. .......... 361/695; 361/725; 361/679.48; 454/184; 312/236; 700/300

(58) Field of Classification Search .......... 361/690, 361/691, 695, 724–727, 679.48, 679.51; 454/184; 165/80.2–80.3; 174/16.1; 312/236; 700/300
See application file for complete search history.

(56) References Cited

U.S. PATENT DOCUMENTS

| | | | |
|---|---|---|---|
| 6,181,557 B1 | 1/2001 | Gatti | |
| 6,604,799 B2 | 8/2003 | Searby et al. | |
| 6,896,612 B1 * | 5/2005 | Novotny | 454/184 |
| 7,031,154 B2 * | 4/2006 | Bash et al. | 361/690 |
| 7,201,651 B2 | 4/2007 | Su | |
| 7,238,104 B1 | 7/2007 | Greenslade et al. | |
| 7,310,737 B2 * | 12/2007 | Patel et al. | 713/300 |
| 7,372,698 B1 * | 5/2008 | Tilton et al. | 361/701 |
| 7,878,888 B2 * | 2/2011 | Rasmussen et al. | 454/184 |
| 2004/0252453 A1 * | 12/2004 | Brooks et al. | 361/687 |
| 2008/0218969 A1 * | 9/2008 | Muraki | 361/695 |
| 2010/0317278 A1 * | 12/2010 | Novick | 454/184 |

* cited by examiner

*Primary Examiner* — Zachary M Pape

(57) ABSTRACT

An electronic component includes a housing having an inlet section, a mid-section, and an outlet section, mounting components for mounting the housing within an electronics cabinet, at least one movable louver positioned in at least one of the inlet section, the mid-section, and the outlet section, an actuator configured to manipulate the at least one movable louver to vary a volume flowrate of airflow through the housing, and a controller configured to operate the actuator to one of substantially maintain an environmental condition change from the inlet to the outlet within a predetermined range and substantially restrict airflow through the housing when the electronic component is in a relatively low operational state.

20 Claims, 4 Drawing Sheets

ELECTRONIC COMPONENT HAVING A MOVABLE LOUVER

BACKGROUND

Electronic components, such as servers and memories, dissipate relatively large amounts of heat during their operations. In order to effectively dissipate this heat, electronic components are typically equipped with internal fans configured to cause a relatively high rate of air to flow over the heat generating components in the electronic components. The fans are typically operated at one of multiple levels depending upon the level of activity currently being performed by the electronic components. The multiple levels are generally set to cause a greater amount of airflow than is necessary for the operating level and thus, the fans typically consume greater amounts of electricity than are necessary.

Fanless electronic components have also been employed in systems where airflow is forced through the electronic components by an external fan. In this types of arrangements, each of the electronic components receive nearly the same levels of airflow, regardless of their respective heat outputs. As such, lower impedance electronic components typically receive an over-abundance of airflow, while higher impedance electronic components receive deficient levels of airflow. Thus, some of the electronic components may receive more cooling airflow than is necessary for those electronic components, which results in a waste of energy.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to exemplary embodiments. In the following description, numerous specific details are set forth to provide a thorough understanding of the embodiments. However, it will be apparent to one of ordinary skill in the art that the present invention may be practiced without limitation to these specific details. In other instances, well known methods and structures have not been described in detail to avoid unnecessarily obscuring the description of the embodiments.

Disclosed herein is an electronic component that includes a housing having an inlet section, a mid-section, and an outlet section, mounting components for mounting the housing within an electronics cabinet, at least one movable louver positioned in at least one of the inlet section, the mid-section, and the outlet section, an actuator configured to manipulate the at least one movable louver to vary a volume flowrate of airflow through the housing, and a controller configured to operate the actuator to substantially maintain an environmental condition change from the inlet to the outlet within a predetermined range. The controller is thus configured to manipulate the position of the at least one movable louver to vary the volume flowrate of airflow through the housing as is necessary to maintain the environmental condition change within the predetermined range. In addition, the controller is configured to substantially restrict airflow through the housing when the electronic component is in a relatively low operational state, to thus avoid unnecessarily supplying electronic components that do not require cooling airflow with airflow.

Also disclosed herein is an integrated cooling and computing system that includes a substantially air-sealed enclosure housing at least one electronics cabinet, wherein at least one of the electronic components discussed above is mounted in the at least one electronics cabinet. The integrated cooling and computing system also includes an air mover for circulating airflow within the enclosure. Thus, the airflow through the at least one electronic component circulated by the air mover may substantially be controlled through manipulation of the at least one louver to substantially maintain the environment condition change across the at least one electronic component within a predetermined range.

Through implementation of the electronic component and integrated cooling and computing system disclosed herein, the provisioning of cooling resources to one or more electronic components may substantially be balanced while accounting for variations in electronic component-level power consumption and flow impedance. As such, the amount of energy required to sufficiently cool the electronic components may substantially be minimized.

Figure 1:
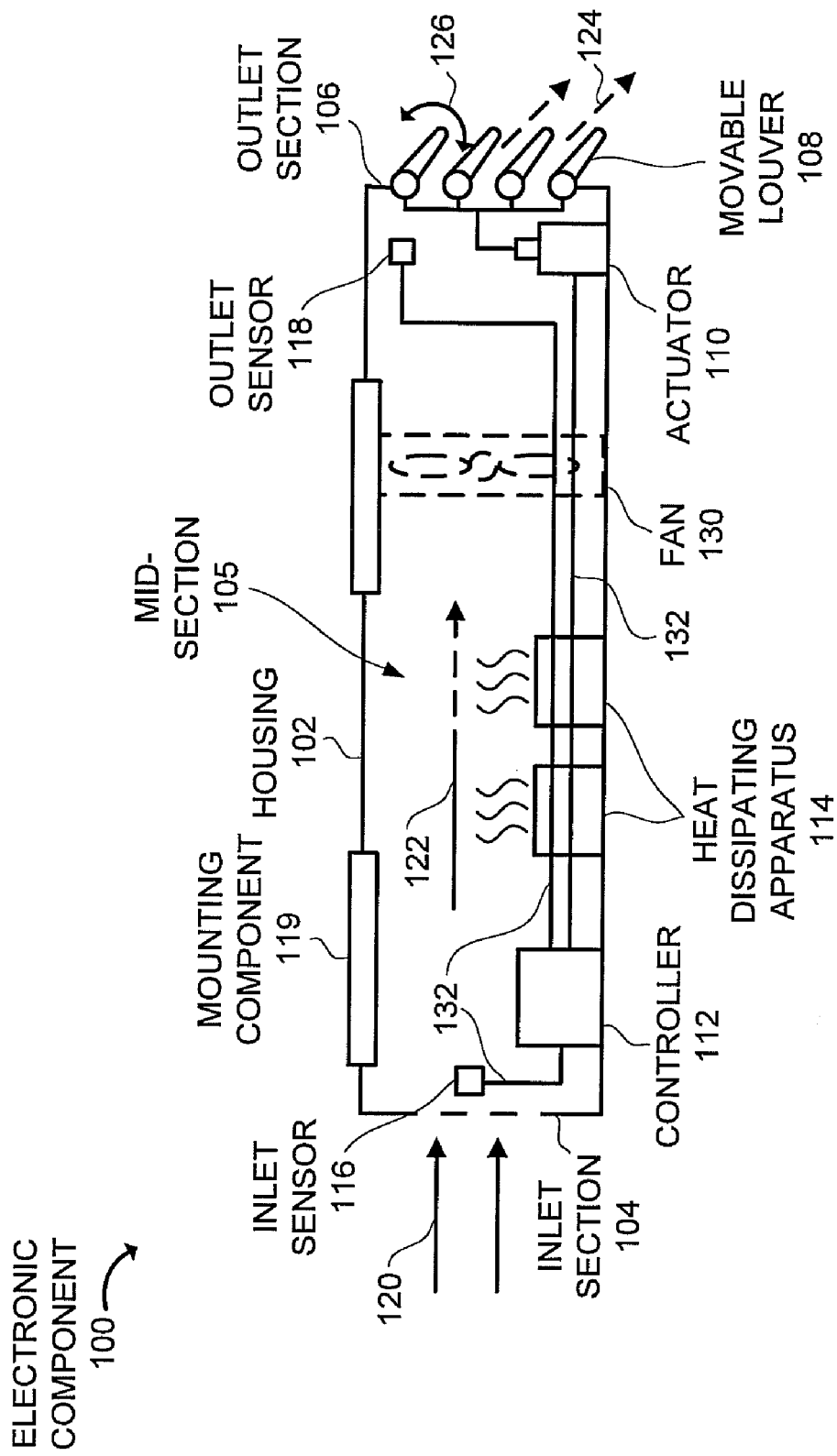
FIG. 1 shows a simplified cross-sectional view of an electronic component, according to an embodiment of the present invention.

With reference first to FIG. 1, there is shown a simplified cross-sectional view of an electronic component 100, according to an embodiment. It should be clearly understood that the electronic component 100 depicted in FIG. 1A may include additional components and that some of the components described herein may be removed and/or modified without departing from a scope of the electronic component 100.

As shown in FIG. 1, the electronic component 100 includes a housing 102, an inlet section 104, a mid-section 105, an outlet section 106, a plurality of movable louvers 108, an actuator 110, a controller 112, a plurality of heat dissipating apparatuses 114, an inlet sensor 116, and an outlet sensor 118. By way of example, the electronic component 100 may comprise a server, a blade server, a hard drive, or other electronic component that may be mounted within an electronics cabinet or rack. In this regard, the electronic component 100 is equipped with mounting components 119 for mounting the electronic component 100 within an electronics cabinet or rack. In addition, the heat generating apparatuses 114 contained within the housing 102 may comprise processors, micro-controllers, high speed video cards, memories, semiconductor devices, power supplies, and the like, which consume electricity and dissipate heat during their operations.

In some embodiments, the electronic component 100 is fanless and thus, air flow through the housing 102 is caused by an external blower or fan as discussed in greater detail herein below. In other embodiments, the electronic component 100 includes one or more fans 130 to cause or to assist in the causing of airflow through the housing 102. The fan 130 has been depicted with dashed lines in FIG. 1 to denote that the fan 130 is optional.

As shown in FIG. 1, airflow (denoted by the arrows 120), for instance, generated by an air mover (depicted in FIG. 2) enters into the housing 102 through openings in the inlet section 104. The airflow 120 becomes heated by absorbing heat dissipated by the heat dissipating apparatuses 114 in the mid-section 105 as shown by the arrow 122. In addition, the heated airflow 122 is exhausted (denoted by the arrows 124) through openings in the outlet section 106.

The volume flow rate of the airflow 122 flowing through the housing 102 is configured to be varied based upon the positions of the movable louvers 108. Although shown at the outlet section 106 of the housing 102, the plurality of movable louvers 108 may additionally/alternately be placed at the inlet section 104 and/or the mid-section 105 of the housing 102. In any regard, the movable louvers 108 may be rotated to various angles as denoted by the arrow 126 to vary the openings through the movable louver 108 and thereby vary the maximum rate at which air may flow through the housing 102. Although particular reference is made herein to the movable louvers 108 being rotatable, it should be understood that other types of louvers may be employed without departing from a scope of the electronic component 100 disclosed herein. For instance, the movable louvers 108 may be configured to be moved along a plane to variably cover openings in the outlet section 106.

As further shown in FIG. 1, the movable louvers 108 are controlled through manipulation of an actuator 110. In addition, the actuator 110 is controlled by the controller 112, which may comprise, for instance, a processor of the electronic component 100 or a separate processor or other controller solely configured for controlling the positions of the movable louvers 108. Alternatively, however, the controller 112 may be positioned externally to the housing 102 and may be configured to control movable louvers 108 in multiple electronic components 100.

In any regard, the controller 112 is configured to receive an environmental condition detected by the inlet sensor 116 and the outlet sensor 118 through signal lines 132. The inlet sensor 116 and the outlet sensor 118 may be configured to detect temperatures, flow rates, pressure drops, etc. In addition, the controller 112 is configured to process the received environmental conditions to determine an environmental condition change occurring through the housing 102. In the event that the environmental condition change exceeds a predetermined range, for instance, a temperature change of about 15-25° C., the controller 112 is configured to instruct the actuator 110 to manipulate the movable louvers 108 to increase the airflow rate through the housing 102. Alternatively, in the event that the environmental condition change falls below the predetermined range, the controller 112 is configured to instruct the actuator 110 to manipulate the movable louvers 108 to decrease the airflow rate through the housing 102. The controller 112 may communicate the instructions to the actuator 110 through a communication line 132. This environmental condition change may correspond to a minimum airflow requirement needed to ensure adequate cooling of the electronic component 100. For instance, in a typical 1U/2U server with fans located inside a server chassis a maximum temperature rise is between about 7-15° C.

In addition, or alternatively, the controller 112 may determine whether the detected environmental condition changes exceed a predetermined maximum set point environmental condition and may vary the airflow through the housing 102 to substantially ensure that the condition within the housing 102 remains below the predetermined maximum set point environmental condition. By way of example, the predetermined maximum set point environmental condition may comprise a predetermined maximum set point temperature, which may comprise, for instance, a recommended temperature below which the electronic component 100 is to be operated, a temperature at which the electronic component 100 is known to have failures, etc.

In addition, in instances where the electronic component 100 is in a relatively low operational state, such as a stand-by state, or is powered off, the controller 112 is configured to operate the actuator 110 to substantially restrict the airflow through the housing 102. In this regard, cooling airflow supplied by an external air mover may be supplied to other electronic components 100 that are at higher operational levels, and thus, the external air mover may be operated to consume a substantially minimized amount of power.

Figure 2:
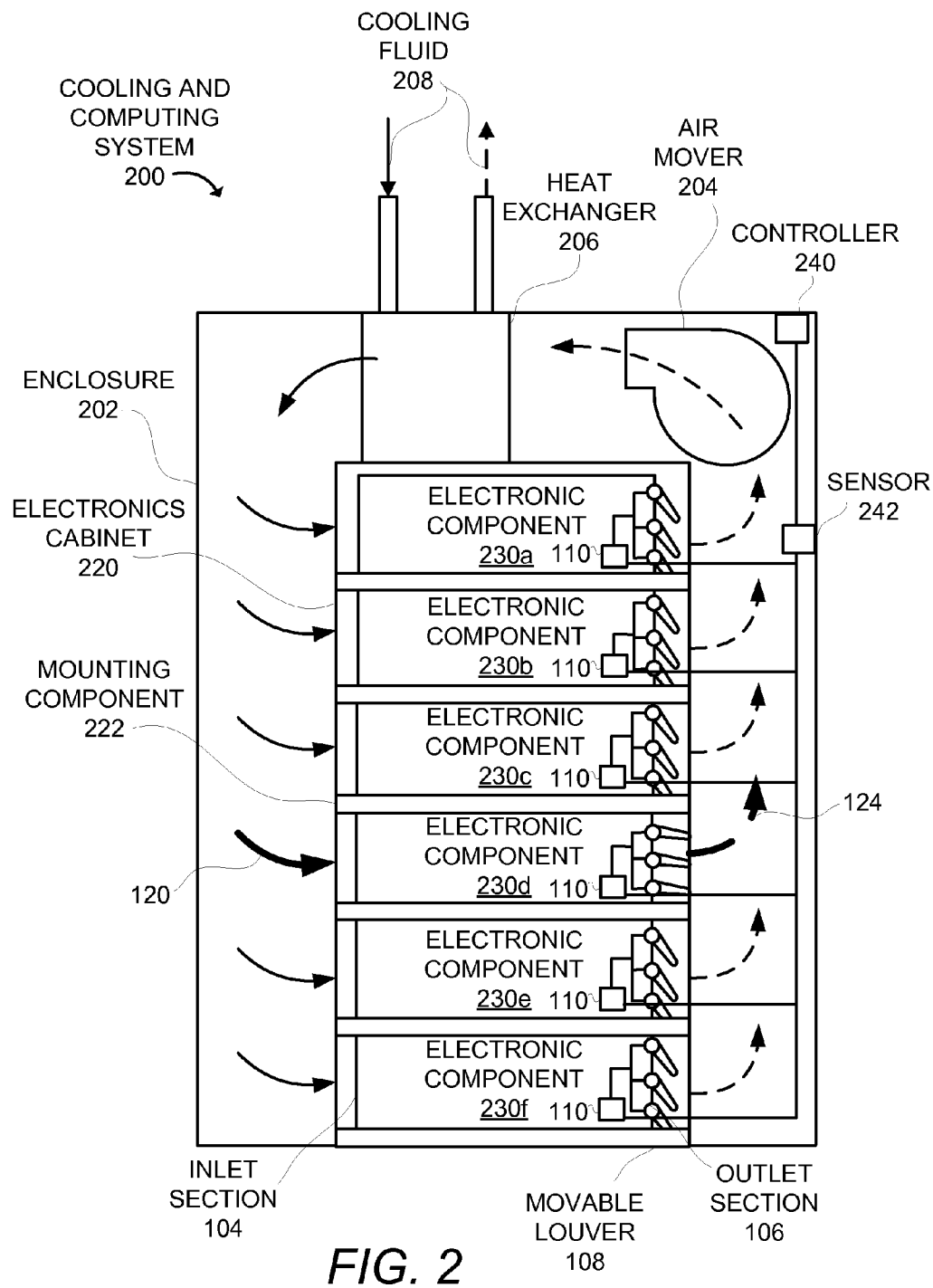
FIG. 2 shows a simplified block diagram of an integrated cooling and computing system, according to an embodiment of the present invention.

Turning now to FIG. 2, there is shown a simplified block diagram of an integrated cooling and computing system 200, according to an embodiment. It should be clearly understood that the integrated cooling and computing system 200 may include additional components and that some of the components described herein may be removed and/or modified without departing from a scope of the integrated cooling and computing system 200.

Generally speaking, the integrated cooling and computing system 200 comprises an integrated structure that may be moved from one location to another, either as a whole or as separate parts, and is thus portable.

As shown in FIG. 2, the integrated cooling and computing system 200 includes a substantially air-sealed enclosure 202, an air mover 204, a heat exchanger 206, and an and outlet through which cooling fluid 208 is delivered to and removed from the heat exchanger 206. The enclosure 202 is described herein as being substantially air-sealed because the enclosure 202 may include vents or other openings (not shown) to enable air to flow into and out of the enclosure 202. By way of example, the vents or other openings in the enclosure 202 may enable a sufficiently small amount of air flow to be exhausted from the enclosure 202 to maintain a level of pressure within the enclosure 202 that is sufficient for adequately cooling the electronic components housed therein.

Also depicted in FIG. 2 is an electronics cabinet 220 positioned within the enclosure 202. Although not shown, the enclosure 202 may house a plurality of electronics cabinets 220, in which each of the electronics cabinets 220 houses and supports, via mounting components 222, a plurality of electronic components 230a-230f. In one regard, the electronics cabinet(s) 220 may comprise conventionally available electronics cabinets suitable for use in data centers or other standalone operations. Although a particular number of electronic components 230a-230f have been depicted as being housed in the electronics cabinet 220, it should be understood that the electronics cabinet 220 may house any reasonably suitable number of electronic components 230a-230f. In addition, although the electronic components 230a-230f have been depicted as comprising horizontally arranged components, it should be understood that the electronic components 230a-230f may be vertically arranged with respect to each other, in manners similar to those to be employed with blade servers.

In any regard, each of the electronic components 230a-230f is configured similarly to the electronic component 100 described above and thus includes all of the features described with respect to the electronic component 100, such as the movable louvers 108. Although each of the electronic components 230a-230f have been depicted as including movable louvers 108, it should be understood that one or more of the electronic components 230a-230f may not be equipped with the movable louvers 108 without departing from the scope of the integrated cooling and computing system 200.

In operation, the air mover 204 is configured to cause airflow to circulate within the enclosure 202, for instance, as shown by the arrows. More particularly, the air mover 204 causes air within the enclosure 202 to flow through the heat exchanger 206, which is configured to cause heat to be exchanged from airflow flowing through the heat exchanger 206 and cooling fluid flowing through the heat exchanger 206, thereby cooling the airflow within the enclosure 202. The cooled airflow flows through respective openings in the inlet sections 104 of the electronic components 230a-230f. In addition, the airflow flows through each of the electronic components 230a-230f and is exhausted through respective outlet sections 106 of the electronic components 230a-230f.

According to an embodiment, through manipulation of the movable louvers 108, the rates at which the airflow flows through each of the electronic components 230a-230f is controlled, for instance, based upon the level of heat dissipation in each of the electronic components 230a-230f. Thus, those electronic components 230a-230f that are dissipating relatively larger amounts of heat are configured to receive greater volume flow rates of airflow than those electronic components 230a-230f that are dissipating relatively lesser amounts of heat. This distinction is depicted in FIG. 2, which shows that the movable louvers 108 of the electronic component 230d are in a position to allow for greater airflow through the electronic component 230d as compared with the movable louvers 108 of the other electronic components 230a-230c, 230e, and 230f.

As discussed above with respect to the electronic component 100, a controller 112 in each of the electronic components 230a-230f may control the positions of the respective movable louvers 108 to substantially maintain an environmental condition change from the inlet to the outlet within a predetermined range and to substantially restrict airflow through the housing when the electronic component is in a relatively low operational state. In addition, or alternatively, the functions of the individual controllers 112 may be performed by one or more other controllers (not shown). In this regard, a single controller may control the flow rates through multiple electronic components 230a-230d. As shown in FIG. 2, the single controller 240 may control the flow rates through communication of control signals to individual actuators 110 in each of the electronic components 230a-230f.

The air mover 204 may also be controlled by a controller 240, for instance, to cause the circulation of airflow within the enclosure 202 to be tuned to the amount of heat being dissipated by the electronic components 230a-230f. Thus, for instance, the air mover 204, and the heat exchanger 206, may be operated in a relatively efficient manner by reducing wasted operations. In addition, the operations of the air mover 204 may further be minimized by reducing the airflow through the electronic components 230a-230f that do not require higher levels of airflow. According to an example, an environmental condition sensor 242 may be positioned to detect an environmental condition, such as, temperature, pressure, flow rate, etc., within the enclosure 202, but external to the electronic components 230a-230f, and the controller 240 may use the conditions detected by the sensor 242 in controlling the air mover 204.

Examples of methods in which the electronic components 230a-230f and the integrated cooling and computing system 200 may be employed will now be described with respect to the following flow diagram of the method 300 depicted in FIG. 3. It should be apparent to those of ordinary skill in the art that the method 300 represents a generalized illustration and that other steps may be added or existing steps may be removed, modified or rearranged without departing from the scope of the method 300.

The description of the method 300 is made with reference to the electronic component 100, the electronic components 230a-230f, and the integrated cooling and computing system 200 illustrated in FIGS. 1 and 2, and thus makes reference to the elements cited therein. It should, however, be understood that the method 300 is not limited to the elements set forth in the electronic component 100, the electronic components 230a-230f, and the integrated cooling and computing system 200 depicted therein. Instead, it should be understood that the method 300 may be practiced by electronic components and integrated cooling and computing systems having different configurations than those depicted in FIGS. 1 and 2.

Figure 3:
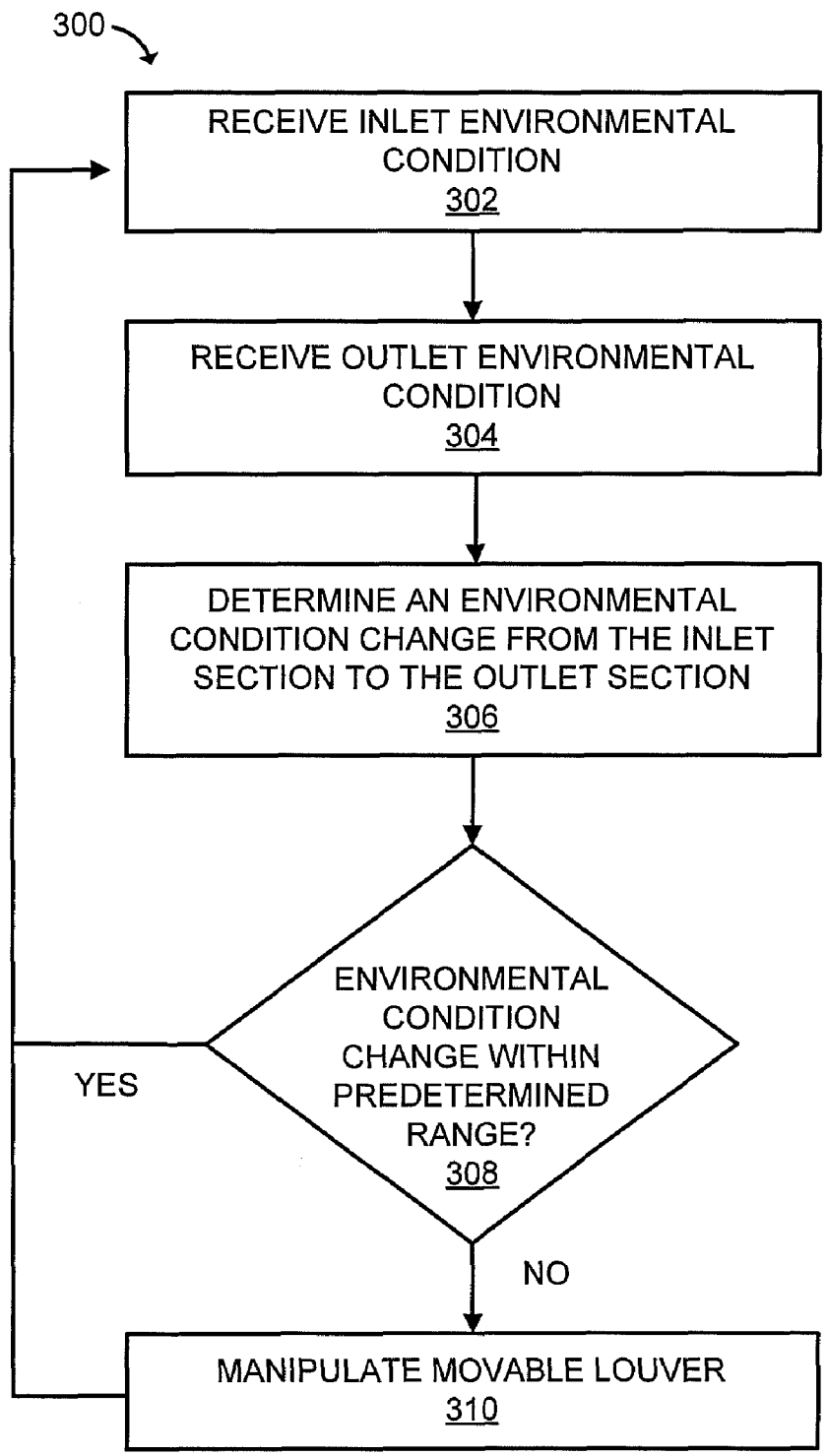
FIG. 3 illustrates a flow diagram of a method for variably cooling at least one electronic component, according to an embodiment of the present invention.

With reference to FIG. 3, there is shown a flow diagram of a method 300 for variably cooling at least one electronic component 100, 230a-230f, according to an embodiment. It should be understood that the method 300 may include additional steps and that some of the steps described herein may be removed and/or modified without departing from a scope of the method 300.

At step 302, the inlet environmental condition near an inlet section 104 of the at least one electronic component 100, 230a-230f is received from an inlet sensor 116 by a controller, for instance, the controller 112. In addition, at step 304, the outlet environmental condition near an outlet section 106 of the at least one electronic component 100, 230a-230f is received from an outlet sensor 118 by the controller. In one embodiment, the controllers 112 in each of the electronic components 100, 230a-230f receives the inlet and outlet environmental conditions. In another embodiment, one or more controllers configured to control a plurality of electronic components 230a-230f receive the inlet and outlet environmental conditions.

At step 306, a determination of an environmental condition change from the inlet section 104 to the outlet section 106 in the at least one electronic component 100, 230a-230f is made, for instance, by the controller 112. This determination may be made based upon the inlet and outlet environmental conditions received at steps 302 and 304. In one embodiment, the controllers 112 in each of the electronic components 230a-230f make this determination for each of the respective electronic components 230a-230f. In another embodiment, one or more controllers make this determination for a plurality of the electronic components 230a-230f.

At step 308, a determination as to whether the environmental condition change from the inlet section 104 to the outlet section 106 is within a predetermined range. The predetermined range may be based on a maximum environmental condition change within which the airflow is able to adequately cool the at least one electronic component 100, 230a-230f, as discussed in greater detail herein above.

For those electronic components 100, 230a-230f whose environmental condition changes are within the predetermined range, the controller(s) 112 cause the movable louvers 108 to remain at their present positions. In addition, the controller(s) 112 continue to receive the inlet and outlet environmental conditions from the inlet sensor 116 and the outlet sensor 118, as indicated at steps 302 and 304.

For those electronic components 100, 230a-230f whose environmental condition changes are outside of the predetermined range, the controller(s) 112 cause the movable louvers 108 of those electronic components 100, 230a-230f to be manipulated, as indicated at step 310. For instance, the controller(s) 112 communicates an instruction signal to the actuators 110 of these electronic components 100, 230a-230f to cause the positions of the movable louvers 108 to vary.

More particularly, at step 310, for those electronic components 100, 230a-230f whose environmental condition changes are below the predetermined range, and are thus likely operating at relatively low heat dissipation levels, the controller(s) 112 manipulates the movable louvers 108 to decrease delivery of airflow through those electronic components 100, 230a-230f. By decreasing the airflow rate through those electronic components 100, 230a-230f, those electronic components 100, 230a-230f are substantially prevented from receiving more airflow that is needed to adequately remove heat from those electronic components 100, 230a-230f. In addition, for those electronic components 100, 230a-230f that are operating at relatively low states, such as, when those electronic components 100, 230a-230f are in a stand by state or in an off-state, the controller(s) 112 manipulates the movable louvers 108 to substantially restrict airflow through those electronic components 100, 230a-230f. In this regard, the amount of air circulation and cooling required by the air mover 204 and heat exchanger 206 may substantially be minimized.

On the other hand, at step 310, for those electronic components 100, 230a-230f whose environmental condition changes are above the predetermined range, and are thus likely operating at relatively high heat dissipation levels, the controller(s) 112 manipulates the movable louvers 108 to increase delivery of airflow through those electronic components 100, 230a-230f. By increasing the airflow rate through those electronic components 100, 230a-230f, those electronic components 100, 230a-230f receive greater amounts of cooling airflow to more adequately remove heat from those electronic components 100, 230a-230f.

Following step 310, the controller(s) 112 may continue to receive the inlet and outlet environmental conditions at steps 302 and 304 and may repeat steps 306-310 in a continuous manner.

According to an embodiment, the controller(s) 112 may employ an iterative process in manipulating the movable louvers 108 at step 310, such as, by incrementally manipulating the movable louvers 108 during each iteration of the method 300. Thus, for instance, the controller(s) 112 may be programmed to manipulate the movable louvers 108 to a predetermined level during each iteration of the method 300. In another embodiment, the controller(s) 112 may manipulate the movable louvers 108 to varying levels depending upon the degree to which the determined environmental condition change varies from the predetermined range.

Although not explicitly shown in FIG. 3, following manipulation of one or more of the movable louvers 108, conditions within the enclosure 202 may be varied. For instance, the amount of cooling airflow supplied to the electronic components 100, 230a-230f may exceed the amount needed to adequately cool the electronic components 100, 230a-230f. In this example, the controller 240 may vary the operations of the air mover 204 to, for instance, minimize the flow rate of air flow supplied to the electronic components 100, 230a-230f, while providing adequate cooling to the electronic components 100, 230a-230f.

Figure 4:
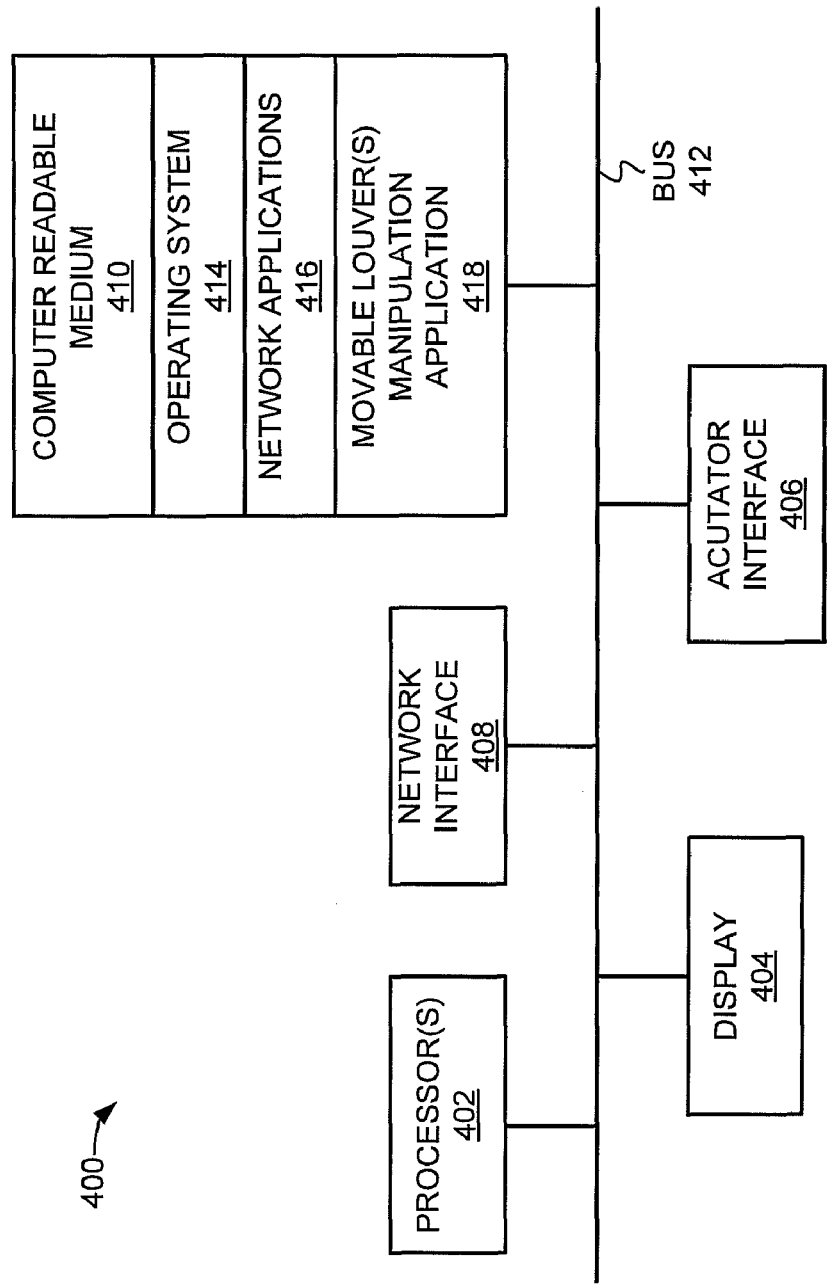
FIG. 4 shows a schematic representation of a computing device configured in accordance with embodiments of the present invention.

The methods employed for variably cooling at least one electronic component 100, 230a-230f with reference to FIG. 3 may be implemented by one or more controllers 112, which may be integrated with one or more electronic components 100, 230a-230f or may comprise a computing device external to the electronic components 100, 230a-230f. Turning now to FIG. 4, there is shown a schematic representation of a computing device 400 configured in accordance with embodiments of the present invention. The computing device 400 may comprise one of the electronic components 100, 230a-230f or an external computing device.

The computing device 400 includes one or more processors 402, such as a central processing unit; one or more display devices 404, such as a monitor; an actuator interface 406; one or more network interfaces 408, such as a Local Area Network LAN, a wireless 802.11x LAN, a 3G mobile WAN or a WiMax WAN; and one or more computer-readable mediums 410. Each of these components is operatively coupled to one or more buses 412. For example, the bus 412 may be an EISA, a PCI, a USB, a FireWire, a NuBus, or a PDS.

The computer readable medium 410 may be any suitable medium that participates in providing instructions to the processor 402 for execution. For example, the computer readable medium 410 can be non-volatile media, such as an optical or a magnetic disk; volatile media, such as memory; and transmission media, such as coaxial cables, copper wire, and fiber optics. Transmission method can also take the form of acoustic, light, or radio frequency waves.

The computer-readable medium 410 may also store an operating system 414, such as Mac OS, MS Windows, Unix, or Linux; network applications 416; and a movable louver(s) manipulation application 418. The operating system 414 may be multi-user, multiprocessing, multitasking, multithreading, real-time and the like. The operating system 414 may also perform basic tasks such as recognizing input from input devices, such as a keyboard or a keypad; sending output to the display 404 and the actuator interface 406; keeping track of files and directories on the computer readable medium 410; controlling peripheral devices, such as disk drives, printers, image capture device; and managing traffic on the one or more buses 412. The network applications 416 includes various components for establishing and maintaining network connections, such as software for implementing communication protocols including TCP/IP, HTTP, Ethernet, USB, and FireWire.

The movable louver(s) manipulation application 418 provides various software components for variably cooling electronic components through manipulation of the positions of movable louvers on the electronic components, as described above. In certain embodiments, some or all of the processes performed by the application 418 may be integrated into the operating system 414. In certain embodiments, the processes can be at least partially implemented in digital electronic circuitry, or in computer hardware, firmware, software, or in any combination thereof.

What have been described and illustrated herein are embodiments of the invention along with some of their variations. The terms, descriptions and figures used herein are set forth by way of illustration only and are not meant as limitations. Those skilled in the art will recognize that many variations are possible within the spirit and scope of the invention, wherein the invention is intended to be defined by the following claims and their equivalents in which all terms are mean in their broadest reasonable sense unless otherwise indicated.

What is claimed is:

1. A cooling and computing apparatus comprising:
a substantially air-sealed enclosure housing at least one electronics cabinet, wherein at least one electronic component is mounted in the at least one electronics cabinet, a housing of said at least one electronic component having an inlet section, a mid-section, and an outlet section, said at least one electronic component comprising:
mounting components for mounting the housing within the electronics cabinet;
at least one movable louver positioned in at least one of the inlet section, the mid-section, and the outlet section;

an actuator configured to manipulate the at least one movable louver to vary a volume flowrate of airflow through the housing; and
a controller configured to operate the actuator to one of substantially maintain an environmental condition change from the inlet section to the outlet section within a predetermined range and substantially restrict airflow through the housing when the electronic component is in a relatively low operational state.

2. The electronic component according to claim 1, further comprising:
an inlet sensor positioned to detect an environmental condition of airflow at the inlet section;
an outlet sensor positioned to detect an environmental condition of airflow at the outlet section; and
wherein the controller is configured to receive the environmental conditions of the airflow detected at the inlet section and the outlet section and to determine the environmental condition change from the received environmental conditions.

3. The electronic component of claim 1, wherein a fan is not provided within or on the housing.

4. The electronic component of claim 1, wherein the controller is further configured to operate the actuator to substantially maintain an environmental condition change of the airflow at the outlet section below a predetermined maximum environmental condition change.

5. The electronic component of claim 1, further comprising:
a fan positioned with respect to the housing to increase a flow rate of the airflow through the housing.

6. The electronic component of claim 5, wherein the controller is configured to control the fan.

7. The electronic component of claim 5, wherein the controller is configured to receive an indication that the fan has been activated and to manipulate the at least one movable louver in response to receipt of an indication that the fan has been activated.

8. An integrated cooling and computing system, said system comprising:
a substantially air-sealed enclosure housing at least one electronics cabinet, wherein at least one electronic component is mounted in the at least one electronics cabinet, said at least one electronic component comprising:
a housing having an inlet section, a mid-section, and an outlet section;
at least one movable louver positioned in at least one of the inlet section, the mid-section, and the outlet section; and
an actuator configured to manipulate the at least one movable louver to vary a volume flowrate of airflow through the housing;
a controller configured to operate the actuator to one of substantially maintain an environmental condition change from the inlet section to the outlet section of the at least one electronic component within a predetermined range and substantially restrict airflow through the housing when the at least one electronic component is in a relatively low operational state; and
an air mover for circulating airflow within the enclosure.

9. The integrated cooling and computing system according to claim 8, said at least one electronic component further comprising:
an inlet sensor positioned to detect an environmental condition of airflow at the inlet section;
an outlet sensor positioned to detect an environmental condition of airflow at the outlet section; and
wherein the controller is configured to receive the environmental conditions of the airflow detected at the inlet section and the outlet section and to determine the environmental condition change from the received environmental conditions.

10. The integrated cooling and computing system according to claim 8, said system comprising a plurality of electronic components mounted in the at least one electronics cabinet, wherein each of the plurality of electronic components comprises:
a housing having an inlet section and an outlet section;
at least one movable louver positioned in at least one of the inlet section and the outlet section; and
an actuator configured to manipulate the at least one movable louver to vary a volume flowrate of airflow through the housing.

11. The integrated cooling and computing system according to claim 8, wherein the controller is configured to individually control the actuators of a plurality of the electronic components to substantially maintain respective environmental condition changes from the inlet sections to the outlet sections of the plurality of electronic components within the predetermined range.

12. The integrated cooling and computing system according to claim 8, further comprising:
an environmental condition sensor positioned to detect an environmental condition of airflow within the substantially air-sealed enclosure and external to the housing of the at least one electronic component;
an air mover controller configured to vary operations of the air mover based upon the environmental condition of airflow detected by the environmental condition sensor.

13. The integrated cooling and computing system according to claim 8, wherein the at least one electronic component is fanless.

14. The integrated cooling and computing system according to claim 8, wherein the at least one electronic component includes a fan, and wherein the controller is configured to control the fan.

15. The integrated cooling and computing system according to claim 8, further comprising:
a heat exchanger positioned to cool airflow circulating through the enclosure.

16. The integrated cooling and computing system according to claim 8, further comprising:
a plurality of electronics racks, each of said plurality of electronics racks housing a plurality of the electronics components.

17. A method for variably cooling at least one electronic component, said at least one electronic component having at least one movable louver positioned to vary airflow through the at least one electronic component, and mounting components for mounting the at least one electronic component within an electronics cabinet, said method comprising:
housing in a substantially air-sealed enclosure the electronics cabinet, wherein the at least one electronic component is mounted in the electronics cabinet;
determining an environmental condition change from an inlet section to an outlet section of the at least one electronic component;
determining whether the environmental condition change is within a predetermined range; and
in response to the environmental condition change from the inlet section to the outlet section being outside of the predetermined range, manipulating the movable louver to vary airflow through the at least one electronic component to one of bring the environmental condition change within the predetermined range and substantially restrict airflow through the housing when the electronic component is in a relatively low operational state.

18. The method according to claim 17, further comprising:
receiving an environmental condition of airflow detected at the inlet section;
receiving an environmental condition of airflow detected at the outlet section; and
wherein determining the environmental condition change further comprises determining the environmental condition change from the received environmental conditions of the airflows detected at the inlet section and the outlet section.

19. The method according to claim 17, wherein the at least one electronic component is fanless.

20. The method according to claim 17, wherein the substantially air-sealed enclosure having an air mover for circulating airflow within the enclosure, said method further comprising: controlling the air mover to vary airflow circulation within the enclosure based upon heat generated in the at least one electronic component.

* * * * *